US012685087B2

(12) United States Patent
Shariff et al.

(10) Patent No.: US 12,685,087 B2
(45) Date of Patent: Jul. 14, 2026

(54) PLASMA DICED WAFERS AND METHODS THEREOF

(71) Applicant: UTAC Headquarters Pte. Ltd., Singapore (SG)

(72) Inventors: Dzafir Bin Mohd Shariff, Singapore (SG); Il Kwon Shim, Singapore (SG); Enrique E. Sarile, Jr., Singapore (SG); Jackson Fernandez Rosario, Singapore (SG); Ronnie M. De Villa, Singapore (SG); Chan Loong Neo, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 684 days.

(21) Appl. No.: 18/072,730

(22) Filed: Dec. 1, 2022

(65) Prior Publication Data

US 2023/0178413 A1     Jun. 8, 2023

Related U.S. Application Data

(63) Continuation-in-part of application No. 18/056,726, filed on Nov. 18, 2022.

(60) Provisional application No. 63/286,513, filed on Dec. 6, 2021.

(51) Int. Cl.
*H10P 72/70*          (2026.01)
*B23K 26/38*          (2014.01)

*H10P 50/24*          (2026.01)
*H10P 54/00*          (2026.01)

(52) U.S. Cl.
CPC .......... *H10P 72/7402* (2026.01); *B23K 26/38* (2013.01); *H10P 50/242* (2026.01); *H10P 54/00* (2026.01); *H10P 72/7416* (2026.01)

(58) Field of Classification Search
CPC ............. H01L 21/6836; H01L 21/3065; H01L 2221/68237; B23K 26/38
See application file for complete search history.

(56) References Cited

U.S. PATENT DOCUMENTS

| | | | |
|---|---|---|---|
| 2007/0218651 A1* | 9/2007 | Higashino | H01L 24/83 438/460 |
| 2008/0277765 A1* | 11/2008 | Lane | H01L 21/78 257/E21.546 |
| 2019/0206676 A1* | 7/2019 | Mou | H01L 21/02049 |

FOREIGN PATENT DOCUMENTS

| | | | | |
|---|---|---|---|---|
| TW | 201448029 A | * | 12/2014 | H10D 84/01 |

* cited by examiner

*Primary Examiner* — Mohammad M Choudhry
(74) *Attorney, Agent, or Firm* — Horizon IP Pte. Ltd.

(57)          ABSTRACT

Reliable plasma dicing of a wafer with a die attach film (DAF) to the bottom wafer surface to singulate it into individual dies is disclosed. Laser processing is employed to form mask openings in a passivation stack of a processed wafer to serve as a dicing mask. A combination of plasma dicing and laser cutting is employed. Plasma is employed to etch the wafer while laser is employed to cut the DAF.

16 Claims, 18 Drawing Sheets

300

PLASMA DICED WAFERS AND METHODS THEREOF

CROSS-REFERENCE TO RELATED APPLICATION

This application claims the benefit of U.S. Provisional Application Ser. No. 63/286,513, filed on Dec. 6, 2021. This application is also a continuation-in-part of the US patent application filed on Nov. 18, 2022, with application Ser. No. 18/056,726, titled PLASMA DICED WAFERS AND METHODS THEREOF. All disclosures are herein incorporated by reference for all purposes.

FIELD OF THE INVENTION

The present disclosure generally relates to plasma dicing of semiconductor wafers. More specifically, the present disclosure is directed to reliable dies from plasma dicing.

BACKGROUND

In semiconductor processing, a wafer is processed to form a plurality of devices thereon. After the devices are formed, the wafer is diced to separate the devices into individual dies. Conventional techniques for dicing employ the use of a dicing saw. The saw cuts the wafer along the x-direction and the y-direction saw lines, one at a time, to separate the wafer into individual dies. Sawing, however, takes time, which slows down the processing throughput. In addition, mechanical sawing causes vibration when cutting the wafer. The vibration may cause cracks in the dies, such as the back-end dielectric, which may impact yields negatively.

To combat the issues of sawing, plasma dicing has been investigated. Plasma dicing entails mounting a wafer onto a wafer ring and inserting the wafer ring with the wafer into a plasma chamber for etching. Unlike mechanical sawing, the plasma etch process singulates the wafer into individual dies in a single plasma etch step without any vibration issues. This significantly improves throughput as well as avoids reliability issues due to cracking.

The present disclosure is directed to reliable plasma dicing of wafers for singulating it into individual dies.

SUMMARY

Reliable plasma dicing of wafers is disclosed. In one embodiment, the present disclosure is related to a device. The device includes device opposing top and bottom device surfaces and device sidewalls. The device also includes a device substrate with opposing active and inactive substrate surfaces. The device also includes a device substrate with side substrate surfaces. The device also includes a BEOL dielectric having opposing top and bottom BEOL dielectric surfaces and side BEOL surfaces. The device further includes a passivation layer disposed on the top BEOL dielectric surface. The passivation layer includes top, bottom and side passivation surfaces. The bottom passivation surface contacts the top BEOL surface. The passivation layer serves as a plasma dicing mask for plasma dicing a wafer with a plurality of devices. The device further includes a die attach film (DAF) disposed on the inactive substrate surface. The DAF includes top, bottom and side DAF surfaces. The top DAF surface is disposed on the inactive substrate surface. The side substrate surfaces, side BEOL surfaces, side passivation surfaces and side DAF surfaces serve as the device sidewalls. The device sidewalls include a first device sidewall portion from the top BEOL surface to the inactive substrate surface. The first device sidewall portion includes an upper first device sidewall sub-portion from the top BEOL surface to an upper portion of the device substrate. The first device sidewall sub-portion includes a first scalloped device sidewall surface. The first device sidewall portion also includes a lower first device sidewall sub-portion from a bottom of the upper portion of the device substrate. The device sidewalls also include a second device sidewall and the second device sidewall portion includes at least the DAF sidewall.

In another embodiment, a method of forming devices is disclosed. The method includes providing a processed wafer processed with a plurality of devices arranged in rows and columns separated by first and second saw streets in first and second orthogonal directions. The processed wafer includes a wafer having opposing inactive and active wafer surfaces. A BEOL dielectric, which includes opposing top and bottom BEOL dielectric surfaces, has its bottom surface disposed on the active wafer surface. A passivation layer, which includes opposing top and bottom passivation surfaces, has its bottom passivation surface disposed on the top BEOL dielectric surface. The passivation layer includes passivation openings to expose the top BEOL dielectric surface for plasma dicing the wafer. A die attach film attached to the inactive wafer surface. The method also includes plasma etching the processed wafer exposed by the passivation openings. The plasma etching etches the BEOL and an upper portion of the device substrate of the processed wafer to form scalloped device sidewall surfaces. The method further includes laterally stretching the wafer to singulate the wafer into devices. The scalloped sidewalls form a first device sidewall portion of the device. The lower portion of the substrate and the DAF form a second device sidewall portion of the devices.

In yet another embodiment, a method of forming devices is disclosed. The method includes providing a processed wafer processed with a plurality of devices arranged in rows and columns separated by first and second saw streets in first and second orthogonal directions. The processed wafer includes a wafer having opposing inactive and active wafer surfaces. A BEOL dielectric, which includes opposing top and bottom BEOL dielectric surfaces, has its bottom surface disposed on the active wafer surface. A passivation layer, which includes opposing top and bottom passivation surfaces, has its bottom passivation surface disposed on the top BEOL dielectric surface. The passivation layer includes passivation openings to expose the top BEOL dielectric surface for plasma dicing the wafer. A die attach film attached to the inactive wafer surface. The method also includes plasma etching the processed wafer exposed by the passivation openings. The plasma etching etches the BEOL and the device substrate of the processed wafer to form scalloped device sidewall surfaces. The method further includes laser cutting the DAF in the passivation openings. The laser cutting causes the DAF to creep up to cover a lower portion of the scalloped device sidewall surfaces.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, with emphasis instead generally being placed upon illustrating the principles of the invention. In the following description, various embodiments of the present invention are described with reference to the following drawings, in which.

DETAILED DESCRIPTION

Embodiments relate to plasma dicing of wafers into individual dies. The plasma dicing, according to various embodiments, results in reliable plasma-diced dies. The present plasma wafer dicing avoids notching on the backside of the wafer or dies, improving process reliability and yields.

Figure 1A:
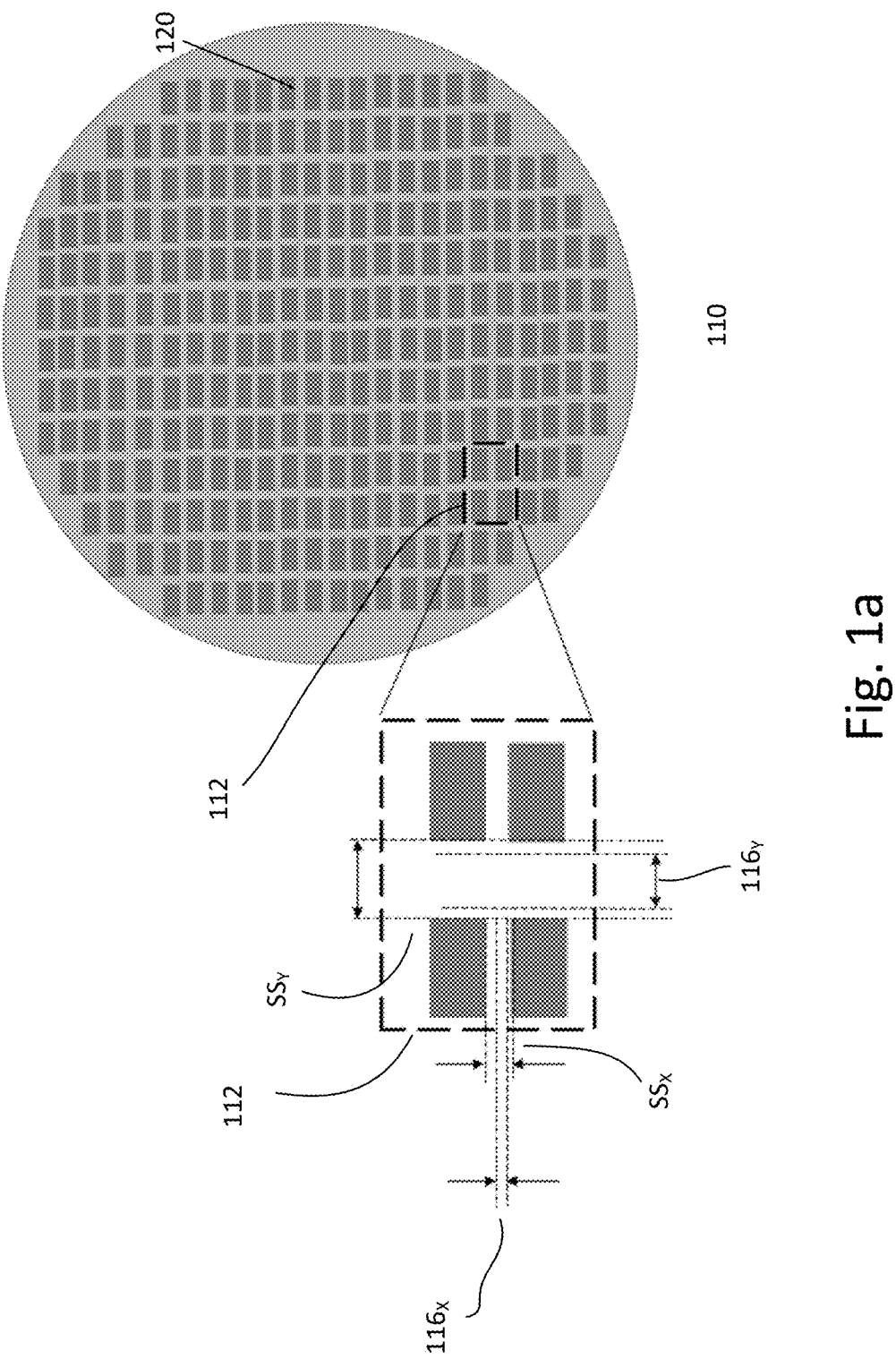
FIG. 1a shows a simplified top view of an embodiment of a processed wafer.

FIG. 1a shows a top view of an embodiment of a wafer 110. The wafer, as shown, is a semiconductor wafer with first and second major surfaces. On a first or active (frontside) surface, the wafer is processed to form a plurality of dies 120. The dies, for example, are arranged in rows (x-direction) and columns (y-direction). Separating the rows and columns of dies are first and second saw streets or dicing lines. For example, x-direction dicing lines SSx and y-direction dicing lines SSy separate the rows and columns of dies on the wafer.

A detailed portion 112 of the wafer which includes adjacent dies in the x-direction and y-direction is shown. As shown, a saw street includes a kerf region within the saw street. For example, an x-direction saw street SSx includes an x-direction kerf region 116x disposed within the saw street. Likewise, a y-direction saw street SSy includes a y-direction kerf region 116y within the saw street. In one embodiment, the kerf region may be about 70 to 80% of the saw street width. Other kerf region widths with respect to the width of the saw street may also be useful.

As shown, the saw streets are defined by the edges of the dies. A kerf region, as shown, is disposed within the saw streets. Typically, test circuitry is disposed within the kerf region for testing the dies on the wafer. During plasma dicing, the kerf region is removed. For example, the gap regions between the kerf region and saw street remain after plasma dicing. Other configurations of the saw streets and kerf regions may also be useful.

Figure 1B:
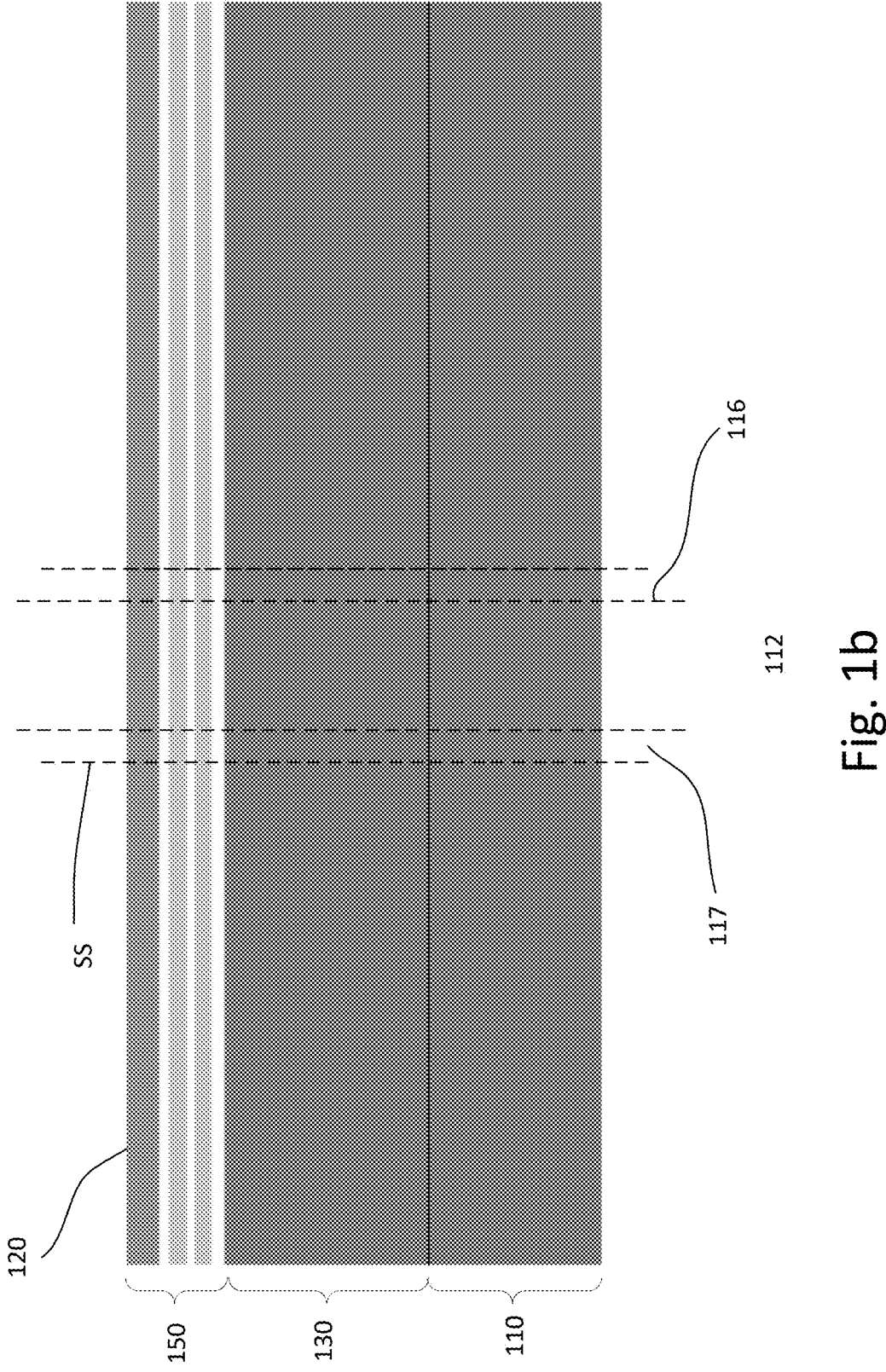
FIG. 1b shows a simplified cross-sectional view of a portion of a processed wafer which includes a saw street between two adjacent dies.

FIG. 1b shows a simplified cross-sectional view of a portion of a processed wafer which includes a saw street between two adjacent dies. As shown, a wafer 110 serves as a substrate for processed dies 120. In one embodiment, the wafer is processed to form dies in parallel separated by orthogonal saw streets SS in the x-direction and y-direction. As shown, between a saw street SS is the kerf region 116. Gap regions 117 exist between a saw street and a kerf region.

In general, the fabrication of devices may involve the formation of features on a substrate that makes up circuit components, such as transistors, resistors, capacitors as well as other circuit components. The components are interconnected, enabling the device to perform the desired functions. To form the features and interconnections, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes.

In one embodiment, features corresponding to the circuit components are formed in, on or above the surface of the wafer. For example, doped regions serving as wells, S/D contacts and well contacts may be formed by ion implantation processes in the substrate while other features, such as gates, capacitors, resistors, isolation regions and other components, may be formed on and above the surface of substrate.

A back-end-of-line dielectric (BEOL) 130 may be formed on the substrate over the circuit components. The BEOL dielectric layer includes a pre-metal interlayer dielectric (ILD) layer disposed over the circuit components and a plurality of intermetal dielectric (IMD) layers disposed over the pre-metal ILD layer. The number of ILD layers may be depending on the CMOS process or technology.

The pre-metal ILD layer includes pre-metal contacts which are connected to contact regions of the components. For example, the pre-metal contacts are connected to S/D regions, transistor gates and well contacts. The pre-metal contacts, for example, may be tungsten (W) contacts. Other types of contacts may also be useful. The pre-metal ILD layer may be formed from multiple dielectric layers. Various dielectric materials, such as silicon oxide ($SiO_2$), may be used to form the pre-metal ILD layer.

As for an IMD layer, it includes a metal dielectric layer below a via dielectric level. The dielectric layers of the IMD layer may be $SiO_2$. Other types of dielectric materials or combinations of dielectric materials or layers may also be useful to form the IMD layer. The metal level includes metal lines and the via level includes via contacts. The uppermost metal level may serve as a pad level in which bond pads for external connections to the dies are disposed. The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process. Other configurations of the IMD layers may also be useful.

Above the BEOL dielectric is a passivation stack 150. The passivation stack includes multiple dielectric passivation layers. For example, the passivation layer may silicon oxide, silicon layer and/or silicon oxynitride layers. The uppermost layer may be silicon nitride. For example, the uppermost passivation layer can be etched selectively from the BEOL dielectric. Other configurations of the passivation layer or stack may also be useful. The passivation stack protects the die. Bond openings may be formed in the passivation stack to expose the bond pads. Bond openings facilitate interconnecting the die and the package substrate during the package assembly process. In one embodiment, the passivation stack is patterned to define openings for plasma dicing of the wafer to singulate it into individual dies. In one embodiment, plasma etch openings correspond to the kerf region within the saw streets. For example, the plasma dicing process removes the kerf regions, leaving the gap regions remaining.

Figure 2A:
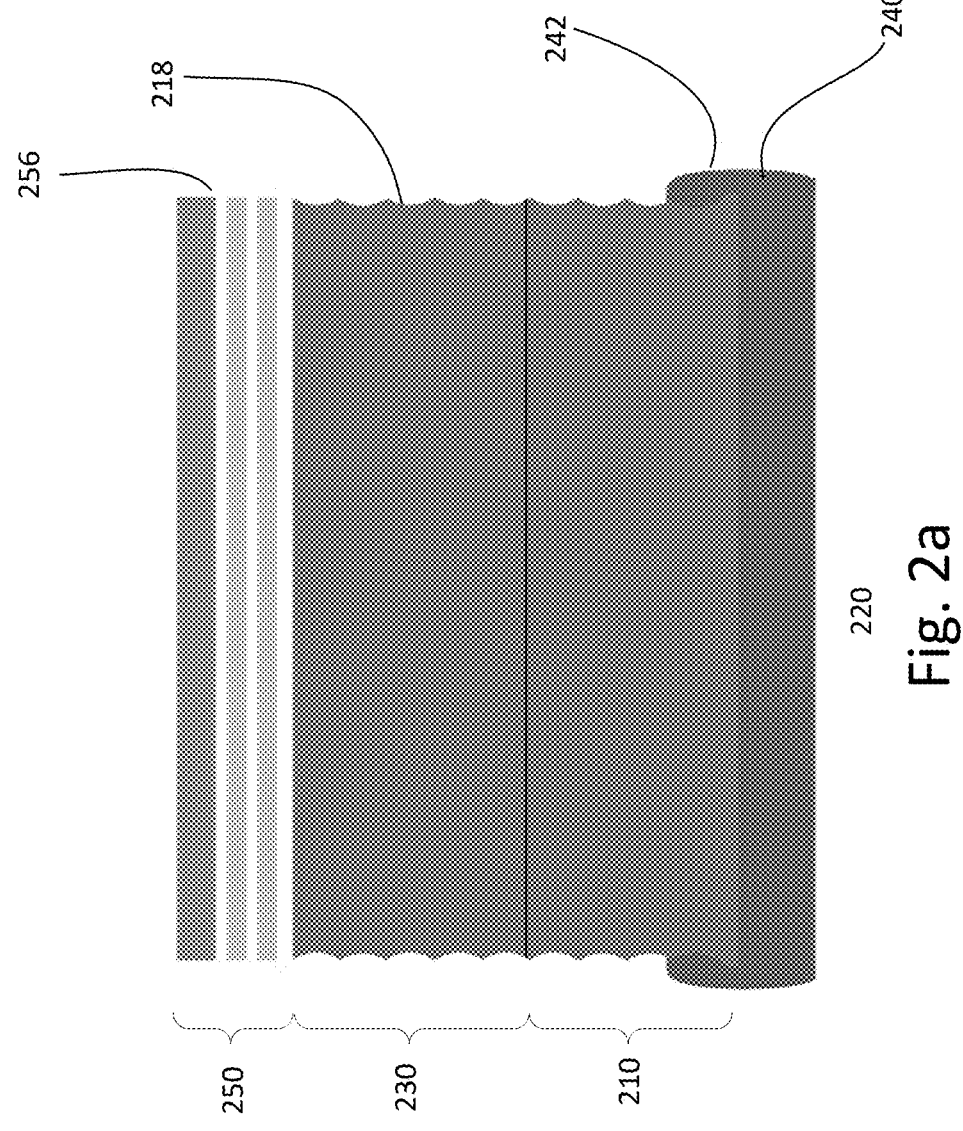
FIGS. 2a-2c show simplified cross-sectional views of embodiments of plasma diced dies after plasma dicing.
Figure 2B:
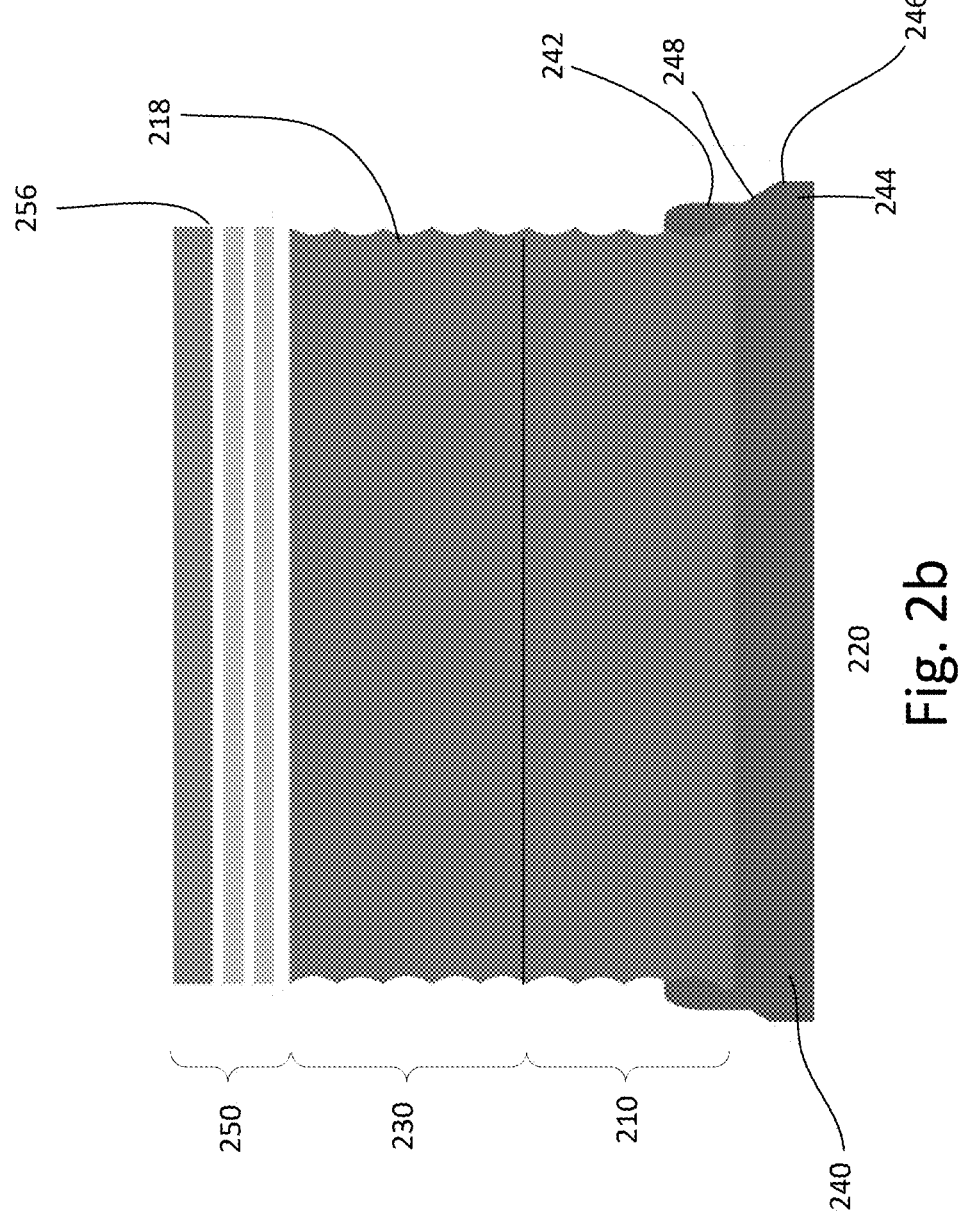
Figure 2C:
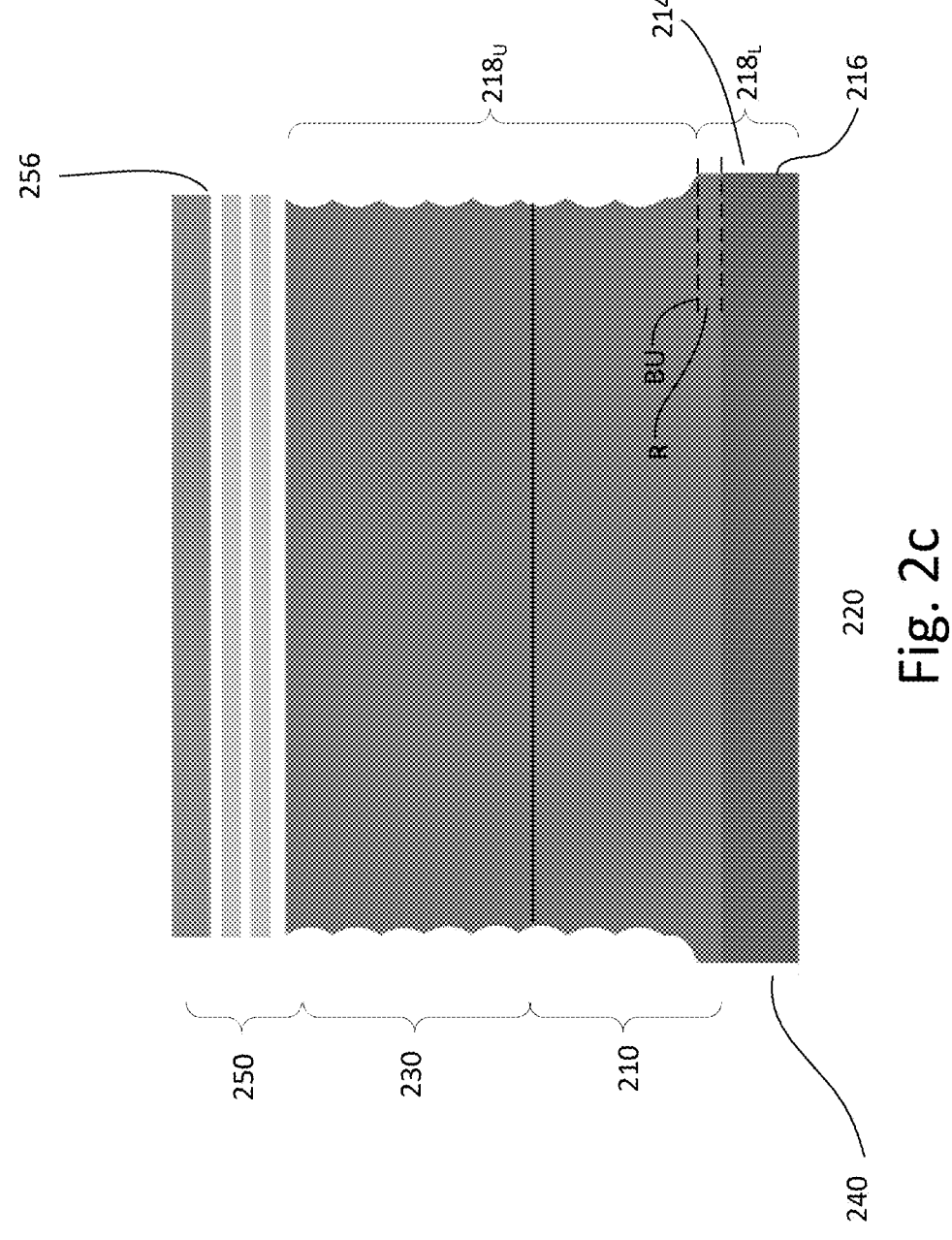

FIGS. 2a-2c show simplified cross-sectional views of embodiments of plasma diced dies after plasma dicing. Referring to FIG. 2a, a simplified cross-section view of an embodiment of a plasma diced die 220 is shown. The cross-section view may be along the x-direction or the y-direction. The die includes a substrate 210 with circuit components. The substrate is a part of the wafer before singulation. Above the substrate is a BEOL dielectric 230 with interconnections for the circuit components. For example, the BEOL dielectric includes an ILD layer with multiple IMD layers thereover. An uppermost metal level dielectric of the IMD layer may serve as a pad level with bond pads.

A passivation stack 250 is disposed over the top of the BEOL dielectric. For example, the passivation stack is disposed over the pad level with bond pads. In one embodiment, the passivation stack includes multiple dielectric passivation layers. For example, the passivation layer may include silicon oxide, silicon nitride and/or silicon oxynitride layers. Other configurations of passivation stacks may also be useful. The passivation stack may include pad openings (not shown) to expose the bond pads for external connections to the internal circuit components of the die. For example, power and input/output (I/O) connections are provided via the bond pads.

In one embodiment, the passivation stack includes flat sidewalls 256. The flat sidewalls form planar surfaces. For example, the passivation stack includes 2 pairs of opposing flat sidewalls. In one embodiment, the flat sidewalls are in the vertical direction. For example, the vertical sidewall walls are orthogonal to the major surfaces of the wafer or substrate of the die, such as the top or bottom substrate surface. The vertical sidewalls are formed by the mask opening process to define the plasma dicing mask. In one embodiment, the vertical sidewalls are formed by single laser beam cutting using a single cut. The single cut, for example, may be effected by a single pass or multiple passes. Other configurations of or forming the passivation sidewalls, such as chamfered sidewalls, may also be useful. Forming mask openings chamfered sidewalls are described in co-pending US patent application (U.S. Ser. No. 18/056,726), titled Plasma Diced Wafers and Methods thereof, which is already herein incorporated by reference for all purposes.

In one embodiment, the die below the passivation stack includes scalloped sidewalls 218. For example, in the case of a rectangular-shaped die, the four sidewalls below the passivation stack have scalloped sidewalls. The scalloped sidewalls, in one embodiment, result from a plasma dicing process using deposition and etch cycles. For example, each deposition and etch cycle forms a scallop-shaped sub-portion.

In one embodiment, the bottom surface of the die includes a die attach film (DAF) 240. The DAF, for example, may be an acrylic or polyester with polyolefin base film suitable for plasma dicing. Other materials suitable for plasma dicing, may also be useful. For example, other materials which are not affected by the etch chemistry used to etch the BEOL dielectric and substrate may also be useful.

In one embodiment, after plasma etching, the DAF is cut by laser. Due to the heat of the laser, the DAF creeps upwards. This results in a DAF creep-up portion 242 covering a lower portion of the substrate 210. The DAF creep-up portion provides added die strength and stability, improving die reliability. For example, it facilitates maintaining the die on to the package substrate after the die is attached thereto during assembly. This improves die shear. Furthermore, laser cutting of the DAF avoids cross-contamination of the plasma chamber. For example, by using laser cutting, different chemistries are not used for the die and DAF. In addition, laser cutting the DAF results in faster cycle time since plasma chamber cleaning is avoided as there is no change in chemistry.

FIG. 2b shows a simplified cross-sectional view of another embodiment of a plasma-diced die 220. The die is similar to that shown in FIG. 2a. Common elements may not be described or described in detail.

The die includes a substrate 210 with circuit components and a BEOL dielectric 230 over the substrate. A passivation stack 250 is disposed over the top of the BEOL dielectric. In one embodiment, the passivation stack includes flat sidewalls 256. In one embodiment, the flat sidewalls are vertical passivation sidewalls 256. Other types of sidewalls for the passivation stack, such as chamfered sidewalls, may also be useful. As shown, the sidewalls of the die below the passivation stack have scalloped sidewalls.

In one embodiment, the bottom surface of the die includes a die attach film (DAF) 240. In one embodiment, the DAF is partially separated by laser processing, forming a creep-up portion 242 covering a lower portion of the substrate 210. The laser beam has a width which is narrower than the width of the plasma dicing channel. The partially cut DAF is separated by force. For example, a dicing tape is stretched to completely singulate the wafer into individual dies. This results in a foot portion 244 in the DAF. For example, the foot portion extends beyond the creep-up portion of the DAF. The side wall profile of the foot may be vertical 246 with a slanted portion 248 due to the partial laser beam cutting profile. The DAF creep-up portion improves die strength and stability. In addition, by not needing to laser etch the DAF completely, cycle time is further improved, resulting in increased process efficiency and lowered manufacturing costs.

Referring to FIG. 2c, a simplified cross-sectional view of yet another embodiment of a plasma diced die 220 is shown. The die is similar to those described in FIGS. 2a-2b. Common elements may not be described or described in detail.

The die includes a substrate 210 with circuit components, a BEOL dielectric 230 over the substrate and a passivation stack 250 over the top of the BEOL dielectric. In one embodiment, the passivation stack includes vertical passivation sidewalls 256. Other types of passivation sidewalls, such as chamfered sidewalls, may also be useful. Attached to the bottom surface of the substrate is a DAF 240.

In one embodiment, the sidewall profile of the die sidewalls below the passivation stack includes a first or upper portion 218u and a second or lower portion 218L. The first portion extends from the top of the BEOL to an upper substrate portion of the substrate. In one embodiment, a remaining portion R of the substrate below the bottom of the upper substrate portion BU has a thickness of about 5-50% of the substrate thickness. Other remaining thicknesses may also be useful. The remaining portion R should enable the breakage of the DAF material when the dicing tape is stretched. The second portion extends from the bottom of the first portion to the bottom of the DAF.

In one embodiment, the first portion 218*u* of the die sidewalls has a scalloped profile. For example, a plasma etch using deposition and etch cycles is employed. The plasma process partially etches the substrate to avoid exposing the DAF. For example, the plasma etches up to the top of the remaining portion R of the substrate. As for the second portion 218L of the die sidewalls, it includes a foot extension profile 214. The foot extension profile is the result of separating the partially diced wafer using force, such as stretching the dicing tape used in the plasma dicing process. The foot extension begins at top of the remaining portion R of the substrate and extends to the bottom of the DAF. For example, the foot extension portion includes a portion of the substrate and the DAF. The side surface of the foot extension includes a vertical sidewall 216 (top remaining portion R of the substrate and DAF). The vertical sidewall surface, in one embodiment, includes a force separated vertical sidewall surface. As for the top of the foot extension, it may include part of the scalloped profile of the first portion.

By having a part of the substrate in the foot extension, backside notching is avoided. This adds strength and stability to the substrate, improving die reliability. In addition, by only partially dicing the die, cycle time is further improved. Cycle time is also improved since chamber cleaning is not necessary by using only one etch chemistry. This results in increased process efficiency and lowered manufacturing costs.

Figure 3:
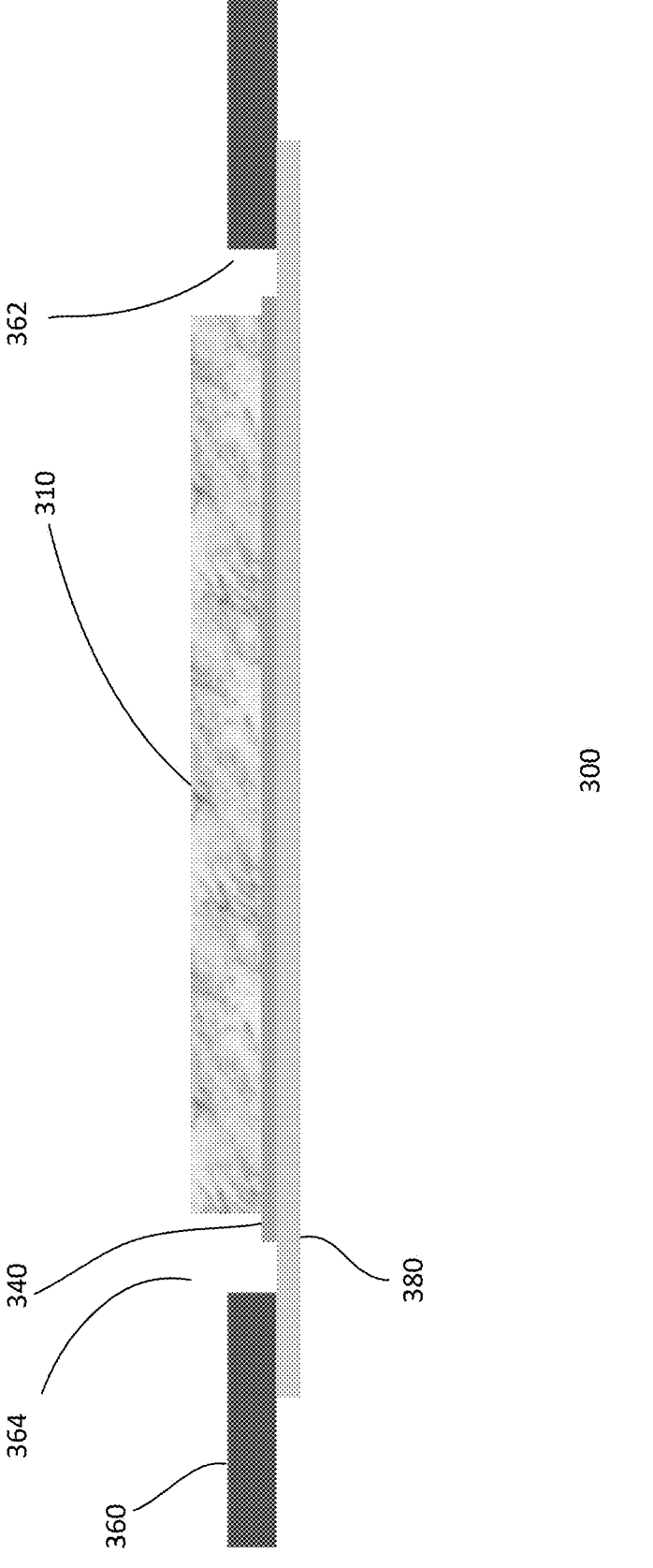
FIG. 3 shows a simplified view of a processed wafer in preparation for plasma dicing.

FIG. 3 shows an exemplary setup 300 for plasma dicing a wafer. As shown, a wafer ring assembly is provided. The wafer ring assembly includes a wafer ring frame 360 with a wafer ring frame opening 364 within the inner edge 362 of the frame. A dicing tape 380 is attached to a bottom surface of the wafer ring frame. In one embodiment, the dicing tape is an expandable dicing tape. An adhesive side of the dicing tape is facing upwards into the wafer ring frame opening. The opening is configured to accommodate a wafer 310. In one embodiment, attached to the bottom surface of the wafer is a DAF 340. For example, the bottom surface of the wafer is attached to the DAF and the DAF is attached to the dicing tape.

When the wafer with DAF is attached to the dicing tape and the wafer frame assembly, the wafer is processed. For example, the passivation layer of the wafer is patterned to form dicing channels in the x-direction and y-directions. Patterning the passivation layer may employ laser processing. Other techniques may also be employed for patterning the passivation layer. After forming dicing channels, the wafer ring assembly may be positioned into a plasma chamber for plasma dicing.

FIGS. 4*a*-4*e* show simplified cross-sectional views of an embodiment of a process 400 for plasma dicing a processed wafer to singulate it into individual dies. Illustratively, a portion of the wafer is shown. The processed wafer and portion of the wafer are similar to that shown in FIGS. 1*a*-1*b* and the dies are similar to the die described in FIG. 2*a*. Common elements may not be described or described in detail.

Figure 4A:
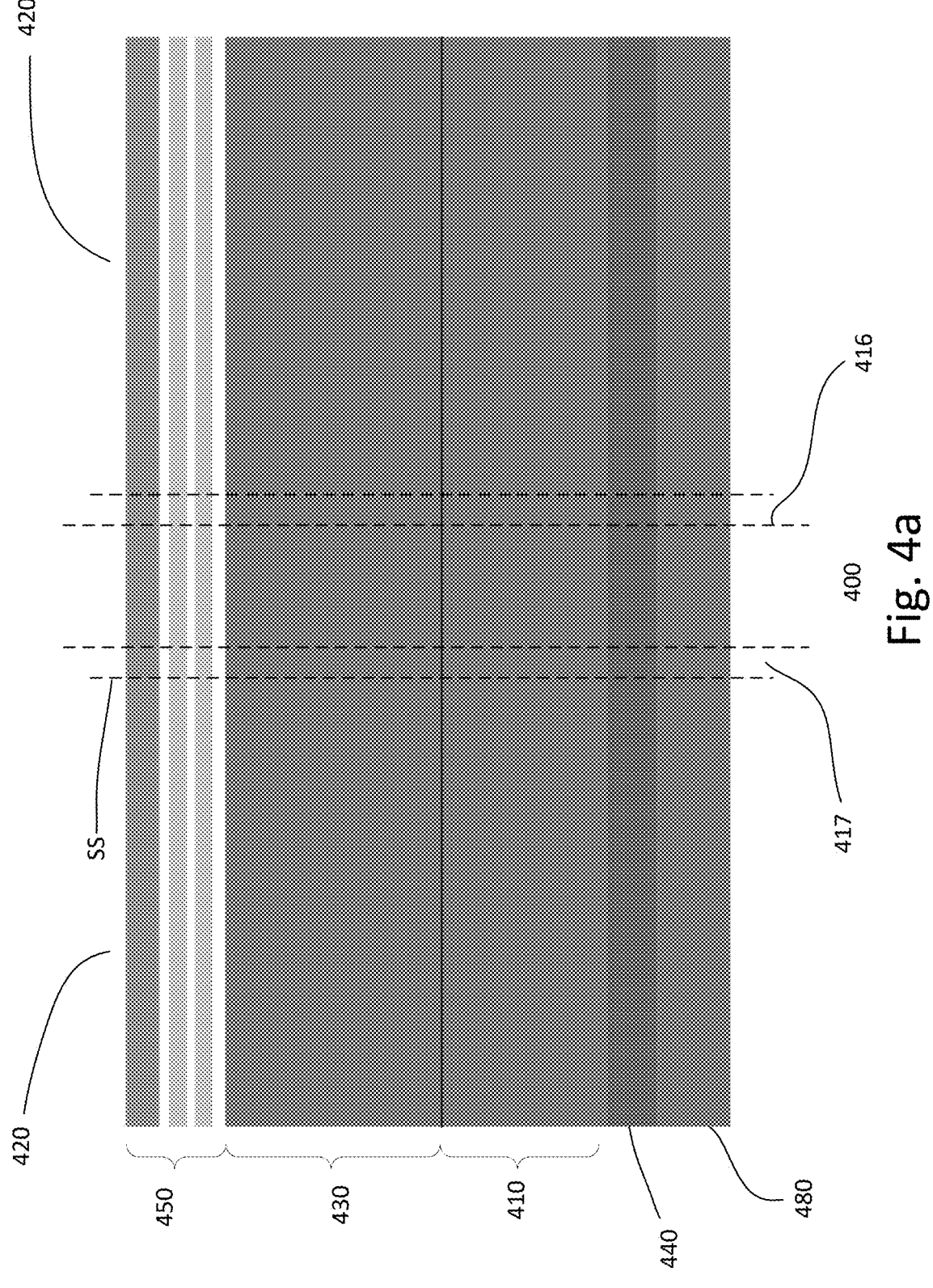
FIGS. 4a-4e show shows simplified cross-sectional views depicting a process for plasma dicing a wafer.

Referring to FIG. 4*a*, the portion of the processed wafer shown includes two adjacent dies 420 with a saw street SS and a kerf region 416 therein. Gap regions 417 separate the edges of the SS and kerf region. The processed wafer includes a wafer 410 processed with circuit components, a BEOL dielectric 430 with interconnects over the wafer and a passivation stack 450 on the BEOL dielectric. In preparation for plasma dicing, the processed wafer with a DAF 440 attached to its bottom surface is mounted onto an adhesive dicing tape 480. The tape, for example, may be mounted onto a tape frame (not shown).

Figure 4B:
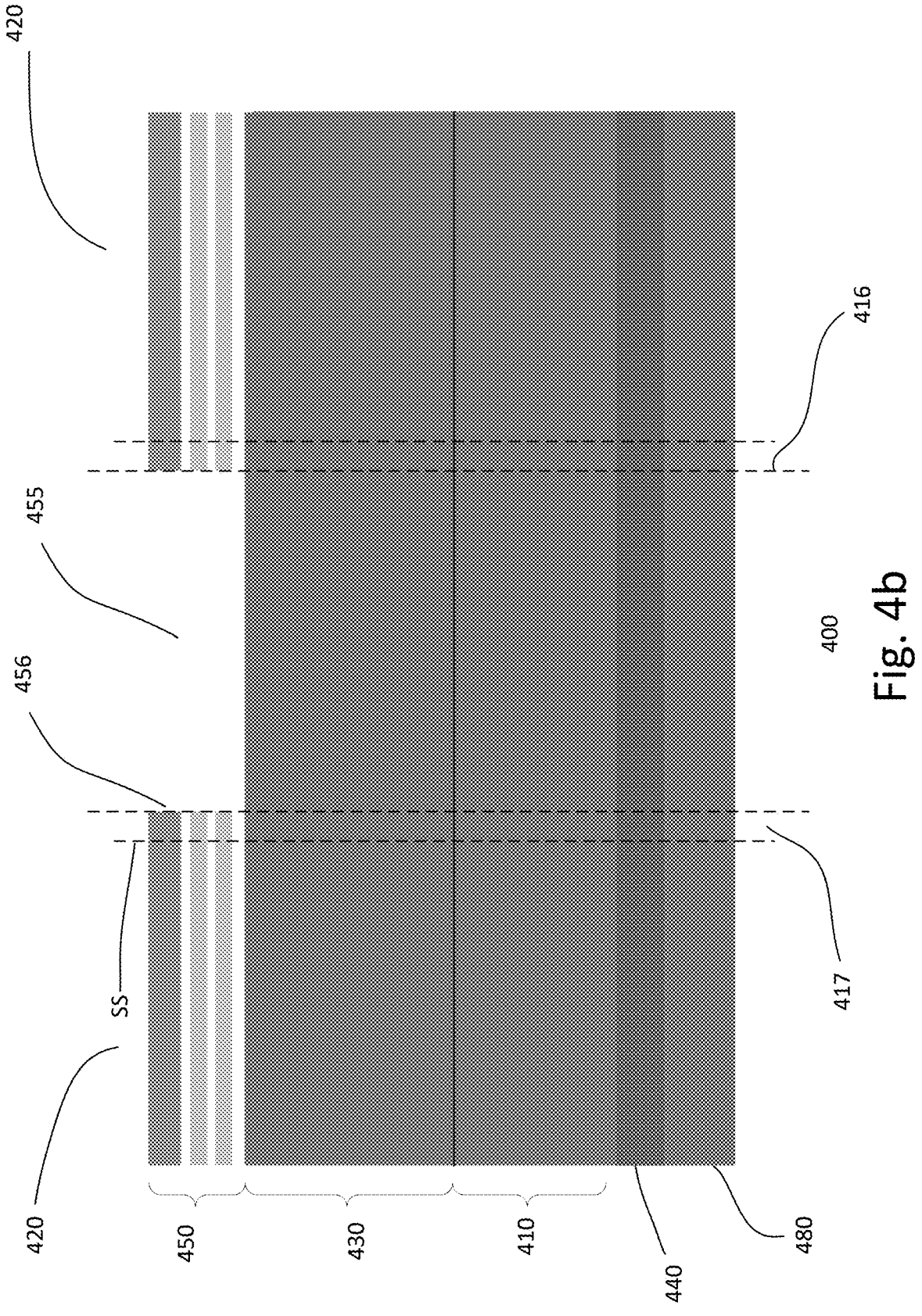

As shown in FIG. 4*b*, the wafer is processed to form mask openings 455 defining plasma dicing channels. For example, the passivation stack serves as a dicing mask for plasma dicing. In one embodiment, the plasma dicing channels correspond to the kerf regions of the wafer. Forming the mask openings may be achieved using laser processing. For example, a laser beam is used to pattern the passivation stack to form mask openings. The mask openings expose the kerf regions of the wafer. The laser beam cuts the passivation stack in the x-direction and y-direction to expose the kerf regions.

In one embodiment, the laser processing forms mask openings in the passivation stack with flat sidewalls 456. In one embodiment, the flat sidewalls are vertical sidewalls. Forming non-vertical flat sidewalls may also be useful. For example, the sidewalls may be chamfered sidewalls. The mask opening process is finished when all kerf regions are exposed. After mask processing is completed, the wafer is transferred to a plasma dicing tool. For example, the wafer is transferred to a plasma chamber of a plasma dicing tool.

Figure 4C:
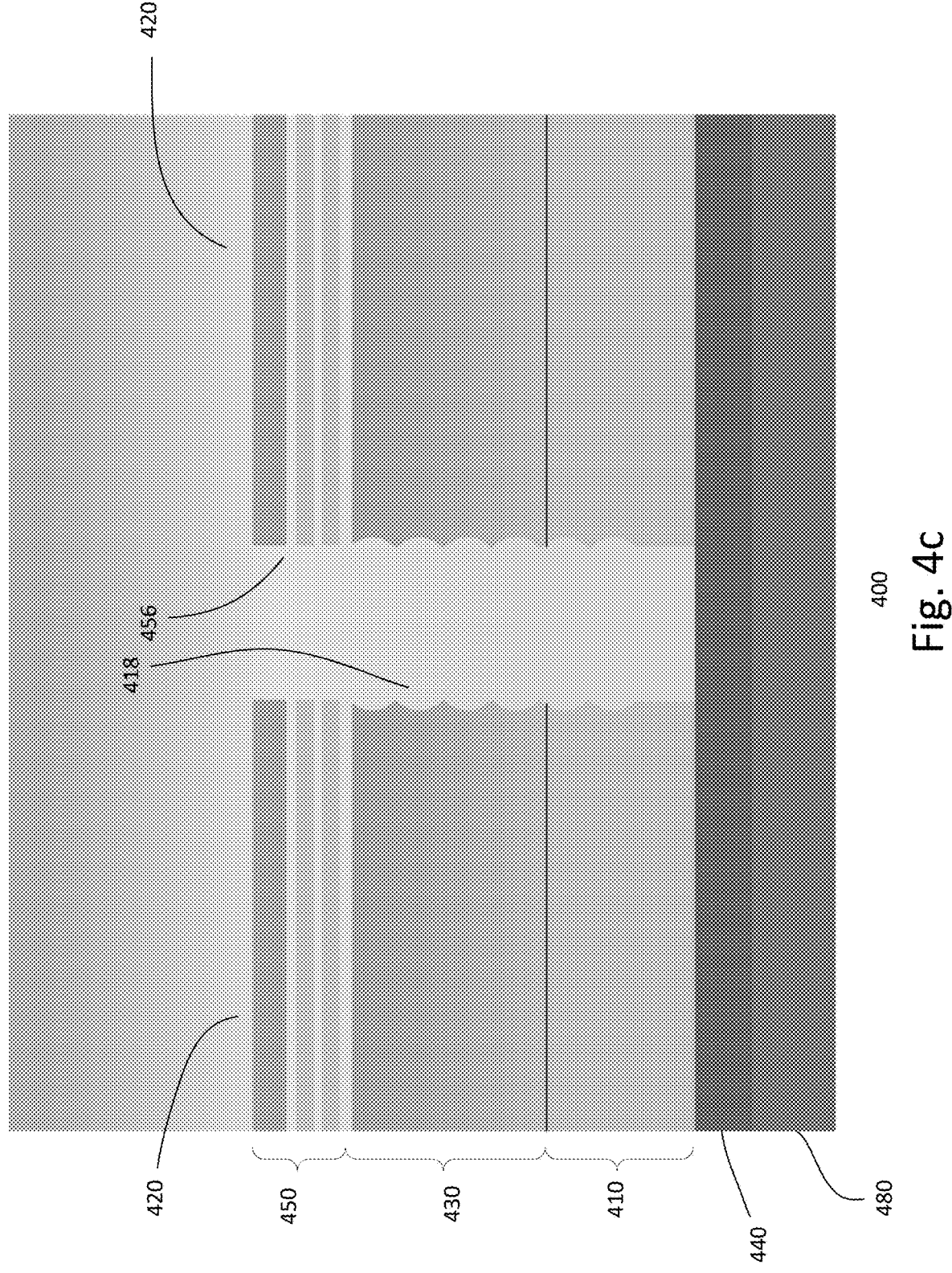

Referring to FIG. 4*c*, the plasma from the plasma dicing tool etches the wafer. The plasma etches completely etches the processed wafer using the passivation stack as the dicing mask. For example, the BEOL dielectric 430 and wafer 410 are etched. The first plasma process, for example, employs deposition and etch cycles. The plasma process forms scalloped die sidewalls 418. Each cycle of deposition and etch forms 1 scalloped sub-portion. However, since the passivation serves as a dicing mask, it is not affected by the plasma etch. For example, the etch chemistry etches the BEOL dielectric and wafer, but not the dicing mask. The plasma processing etches the processed wafer until the DAF 440 is exposed. The etch chemistry is selected for dicing the wafer but not the DAF. As shown, the substrate of the dies includes backside notching due to the scalloped die sidewalls.

Figure 4D:
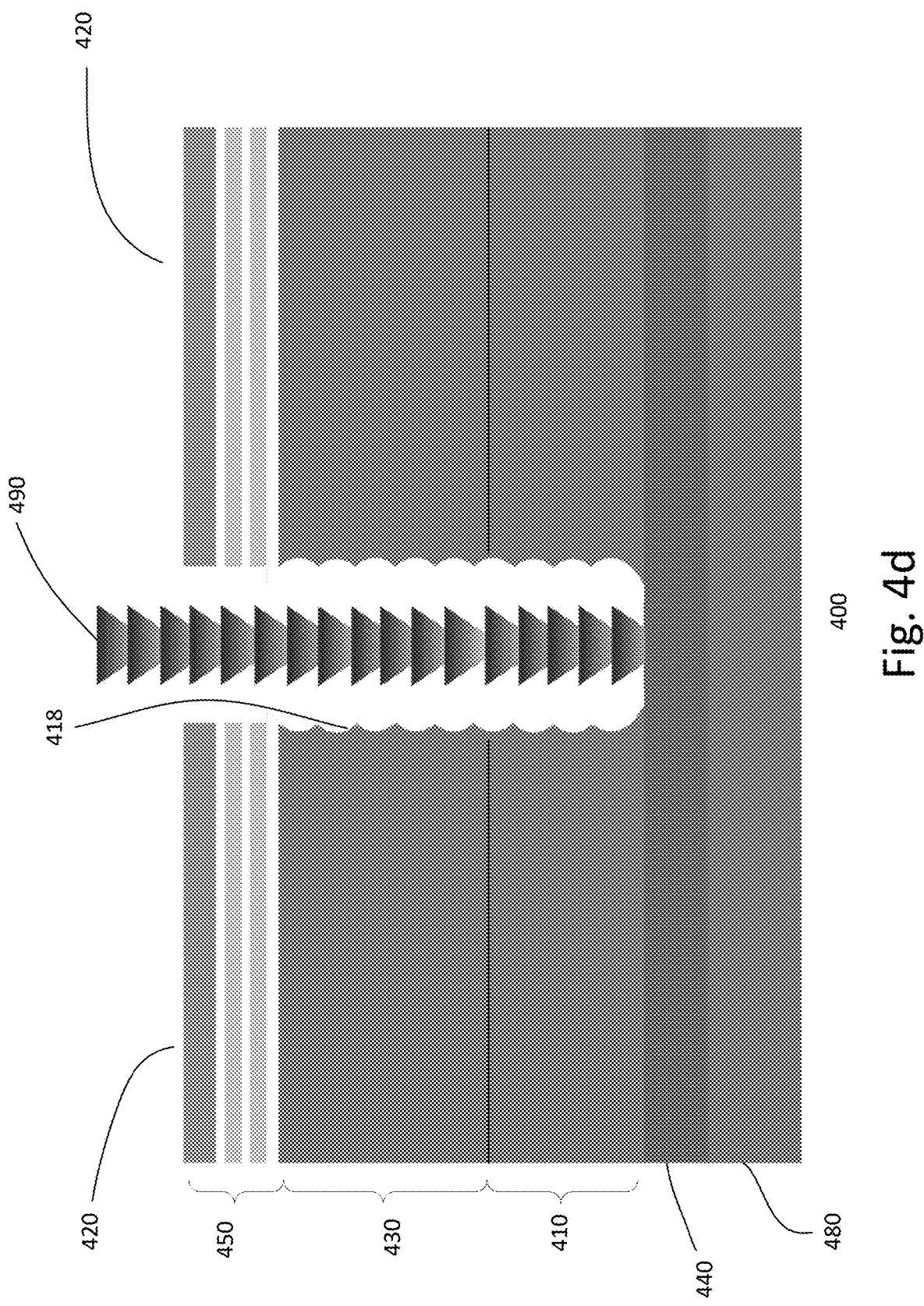

In FIG. 4*d*, after plasma processing, the wafer ring assembly with the diced wafer is removed from the plasma tool. In one embodiment, laser processing is performed to cut the DAF 440. The laser processing includes scanning the dicing channels between the die sidewalls with a laser beam 490 to cut the DAF. The width of the laser beam is narrower than the dicing channel. For example, the width of the laser beam may be about 8-9 um beam diameter while the dicing channel is about 30 um wide. The width of the laser beam is about 30 percent of the width of the dicing channel. Providing other widths of the laser beam which is narrower than the dicing channel may also be useful. The number of passes per cut depends on the DAF material.

Figure 4E:
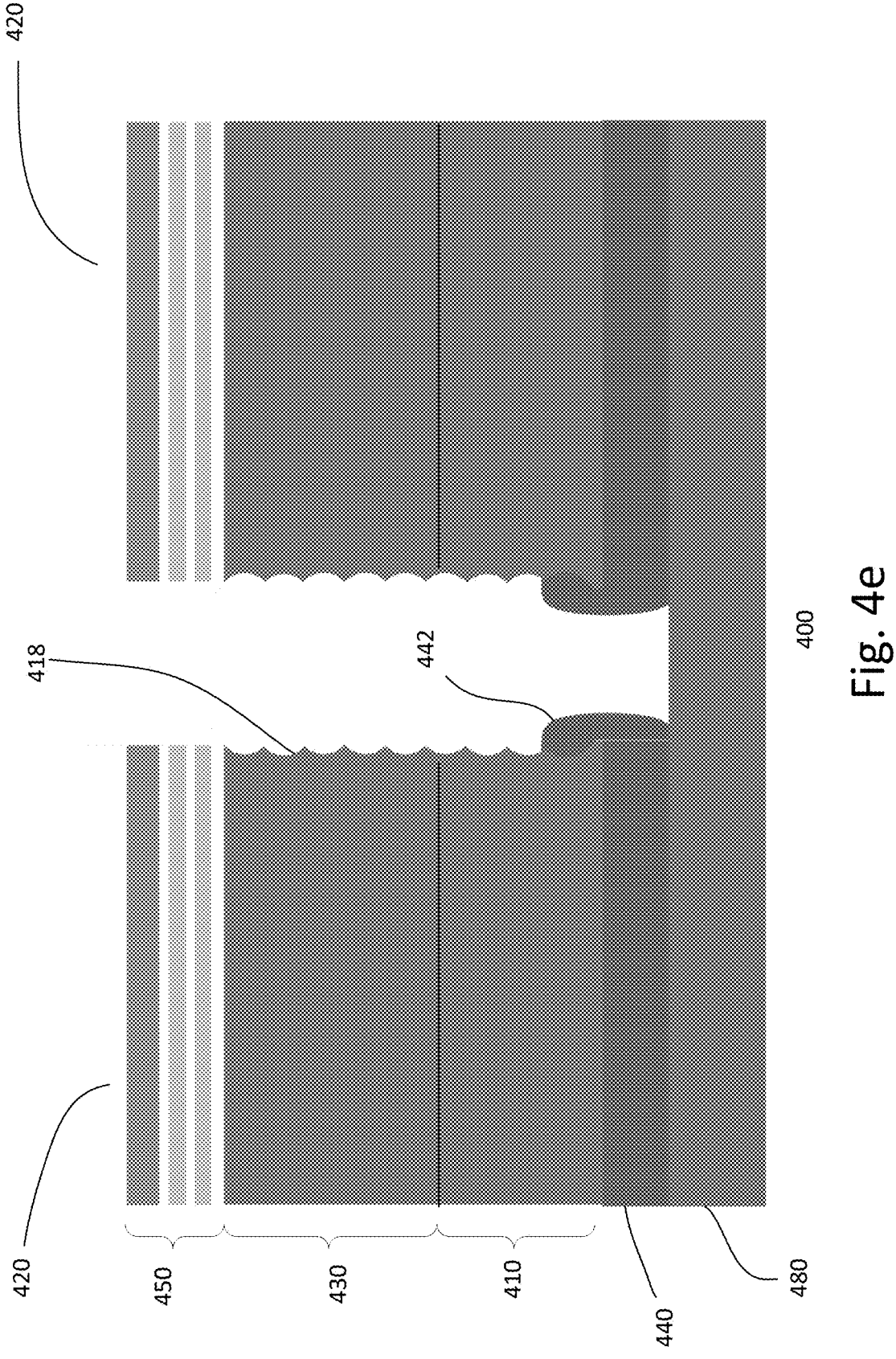

Referring to FIG. 4*e*, the laser fully cuts the DAF, completely singulating the processed into individual dies 420 with the DAF on the bottom substrate surface. As the laser cuts the DAF, the heat from the laser causes the DAF to creep upwards. This results in a DAF creep-up portion 442 covering a lower portion of the substrate sidewalls. The DAF creep-up portion protects the backside notching of the die substrate. For example, the creep-up portion provides added die strength and stability, improving die reliability.

Furthermore, laser cutting of the DAF avoids cross-contamination of the plasma chamber. For example, by using laser cutting, different chemistries are not used for the die and DAF separation. In addition, laser cutting the DAF results in faster cycle time since plasma chamber cleaning is avoided as there is no change in chemistry in the plasma chamber for the wafer singulation process.

FIGS. 5a-5d show simplified cross-sectional views of another embodiment of a process 500 for plasma dicing a processed wafer to singulate it into individual dies 520. Illustratively, a portion of the wafer is shown. The processed wafer, including the portion of the wafer, is similar to that shown in FIGS. 1a-1b and the dies are similar to the die described in FIG. 2b. In addition, the process is similar to that described in FIGS. 4a-4e. Common elements may not be described or described in detail.

Figure 5A:
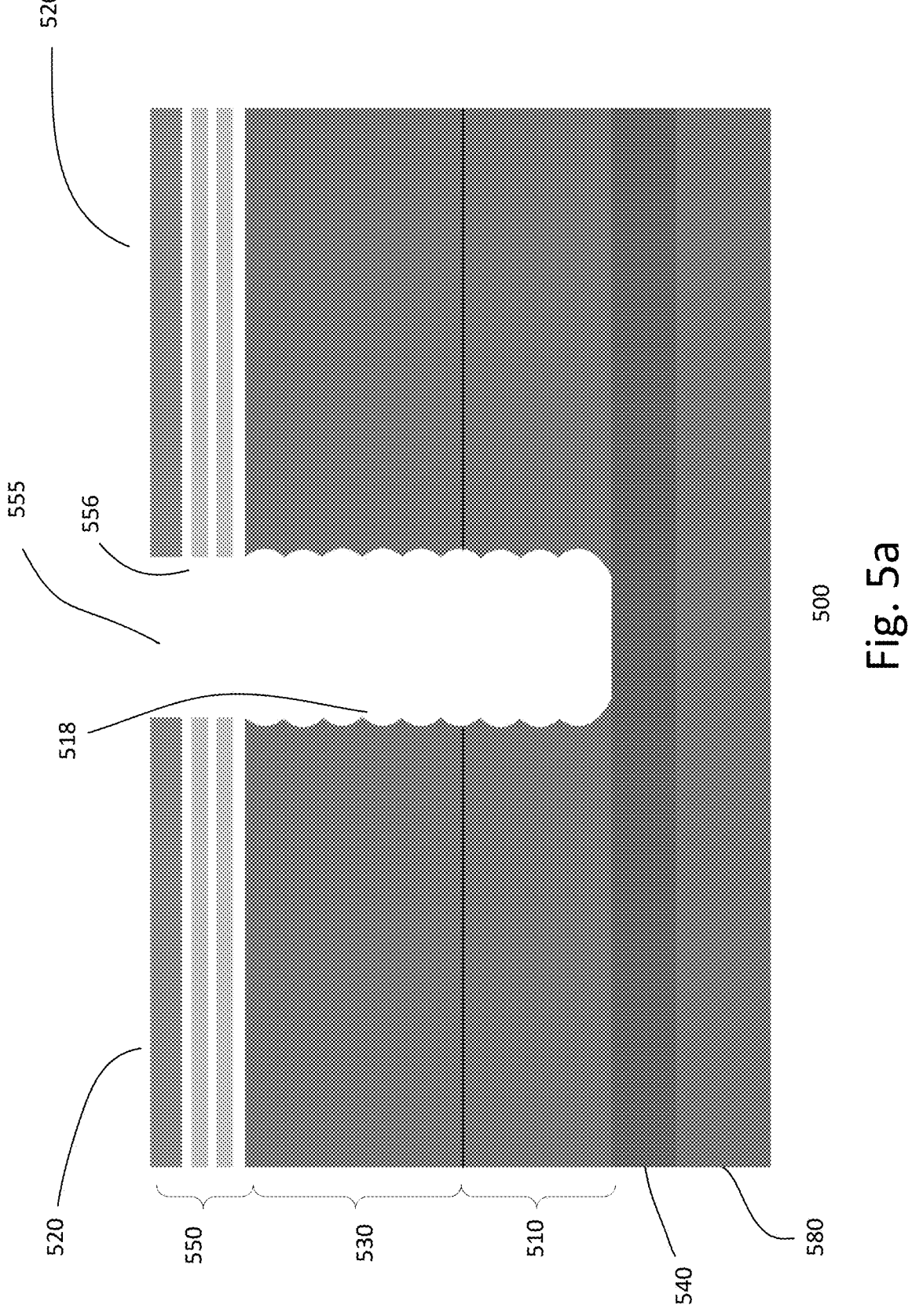
FIGS. 5a-5d shows show a simplified cross-sectional view depicting another process for plasma dicing a wafer.

Referring to FIG. 5a, a processed wafer with mask openings 555 and passivation stack 550 with flat sidewalls 556 is shown at the stage of the dicing process illustrated in FIG. 4c. For example, the plasma of the plasma dicing tool completely etches the processed wafer using the passivation stack as the dicing mask. For example, the BEOL dielectric 530 and wafer 510 are etched to form scalloped sidewalls 518. As shown, the DAF 540 mounted onto an adhesive dicing tape 580 is exposed. The wafer ring assembly with the wafer is removed from the plasma chamber.

Figure 5B:
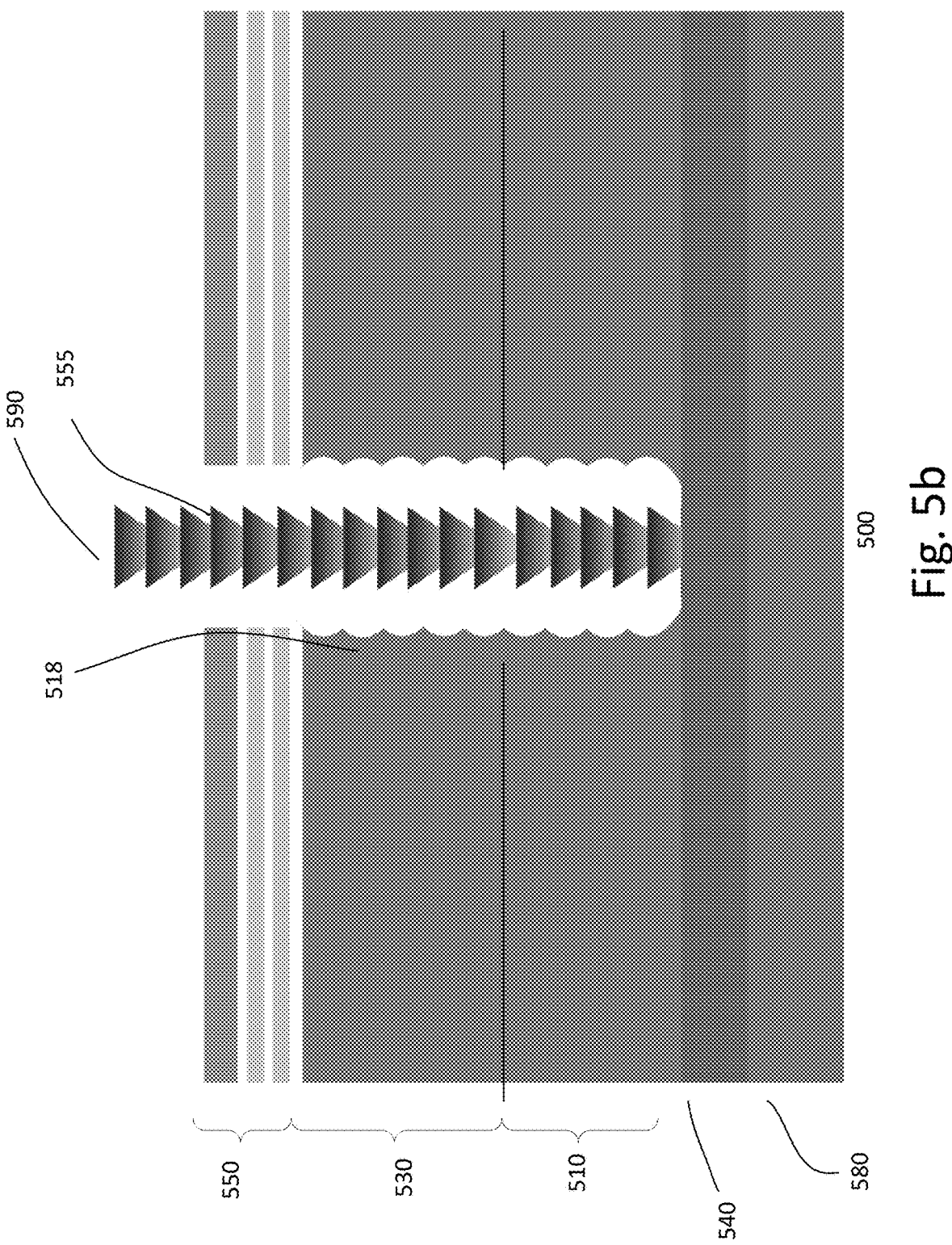

In FIG. 5b, laser processing is performed, in one embodiment, to partially cut the DAF. The laser processing includes scanning the dicing channels between the die sidewalls with a laser beam 590 having a narrower width than the dicing channels to cut the DAF.

Figure 5C:
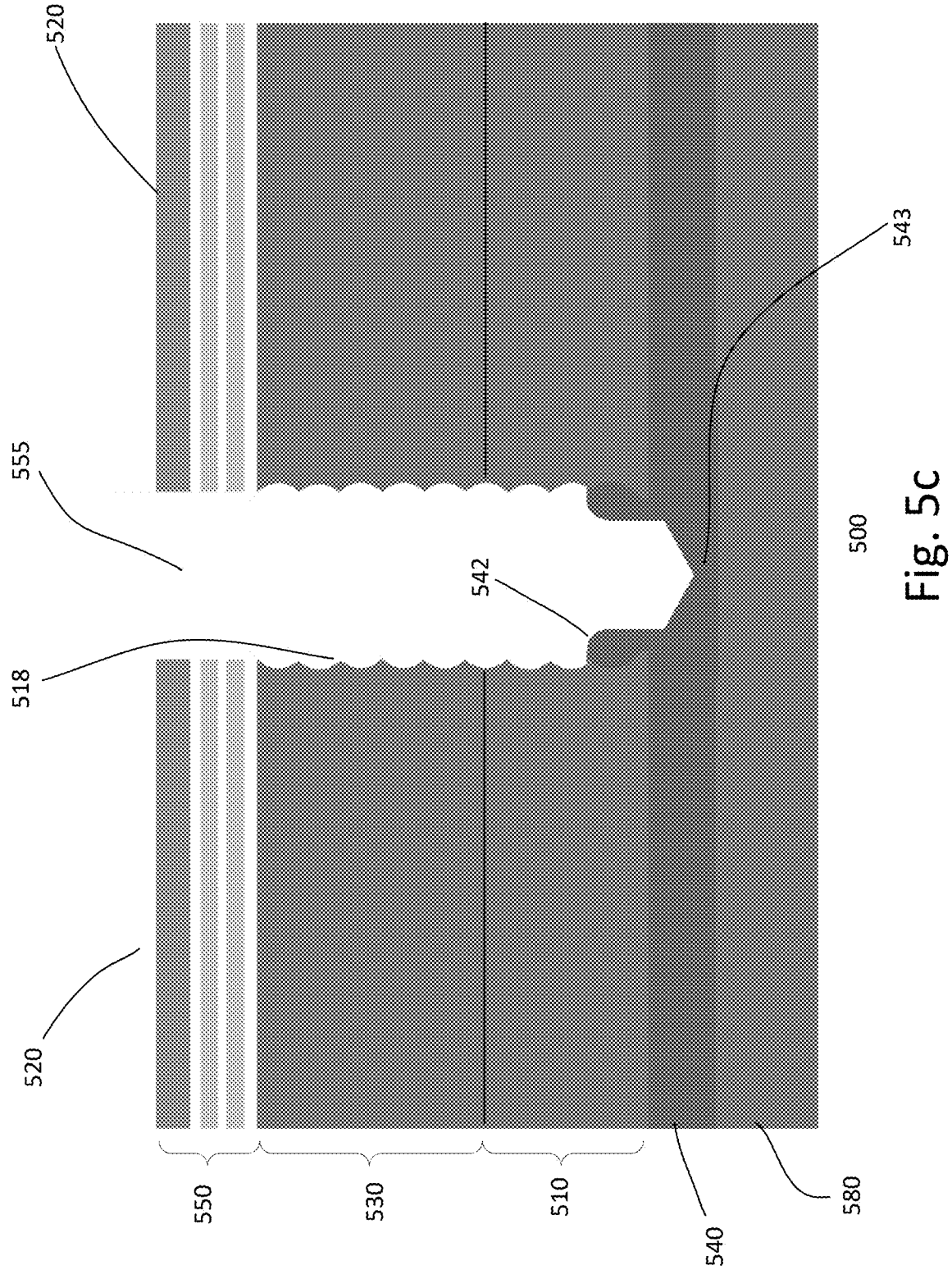

Referring to FIG. 5c, the laser partially cuts the DAF. As the laser cuts the DAF, the heat from the laser causes the DAF to creep upwards. This results in a DAF creep-up portion 542 covering a lower portion of the substrate scalloped sidewalls. The DAF creep-up portion protects the backside notching of the die substrate. The partial cut of the DAF leaves a remaining portion 543 connecting the dies 520.

Figure 5D:
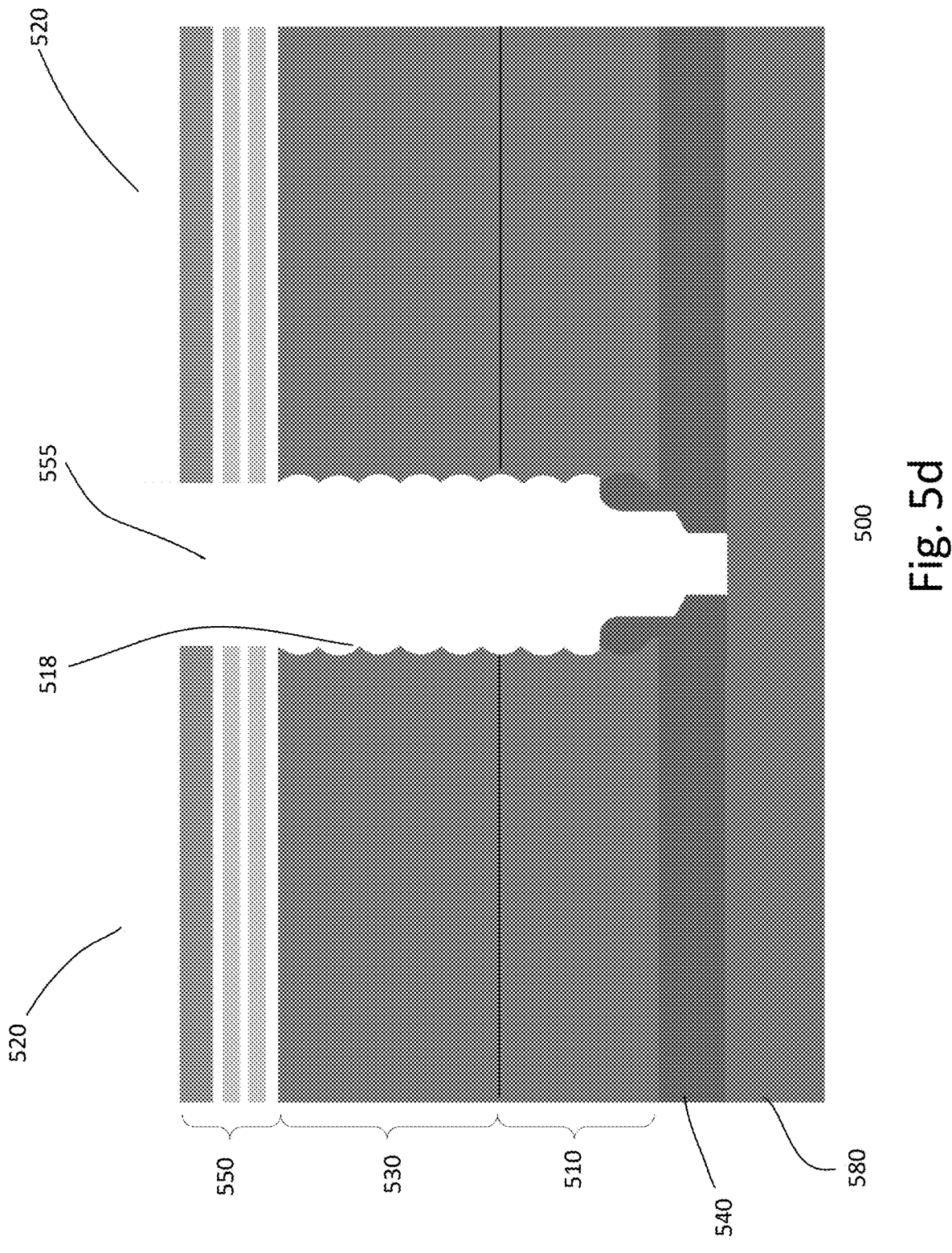

Referring to FIG. 5d, the dicing tape is stretched laterally to completely separate the dies with the DAF. For example, force is used to break the DAF, completely separating the dies 520.

As described, laser cutting to partially cut the DAF avoids cross-contamination of the plasma chamber. For example, by using laser cutting, different chemistries are not required for use in the plasma chamber for the die and DAF separation. In addition, laser cutting the DAF results in faster cycle time since plasma chamber cleaning is avoided as there is no change in chemistry in the plasma chamber for the wafer singulation process.

Figure 6A:
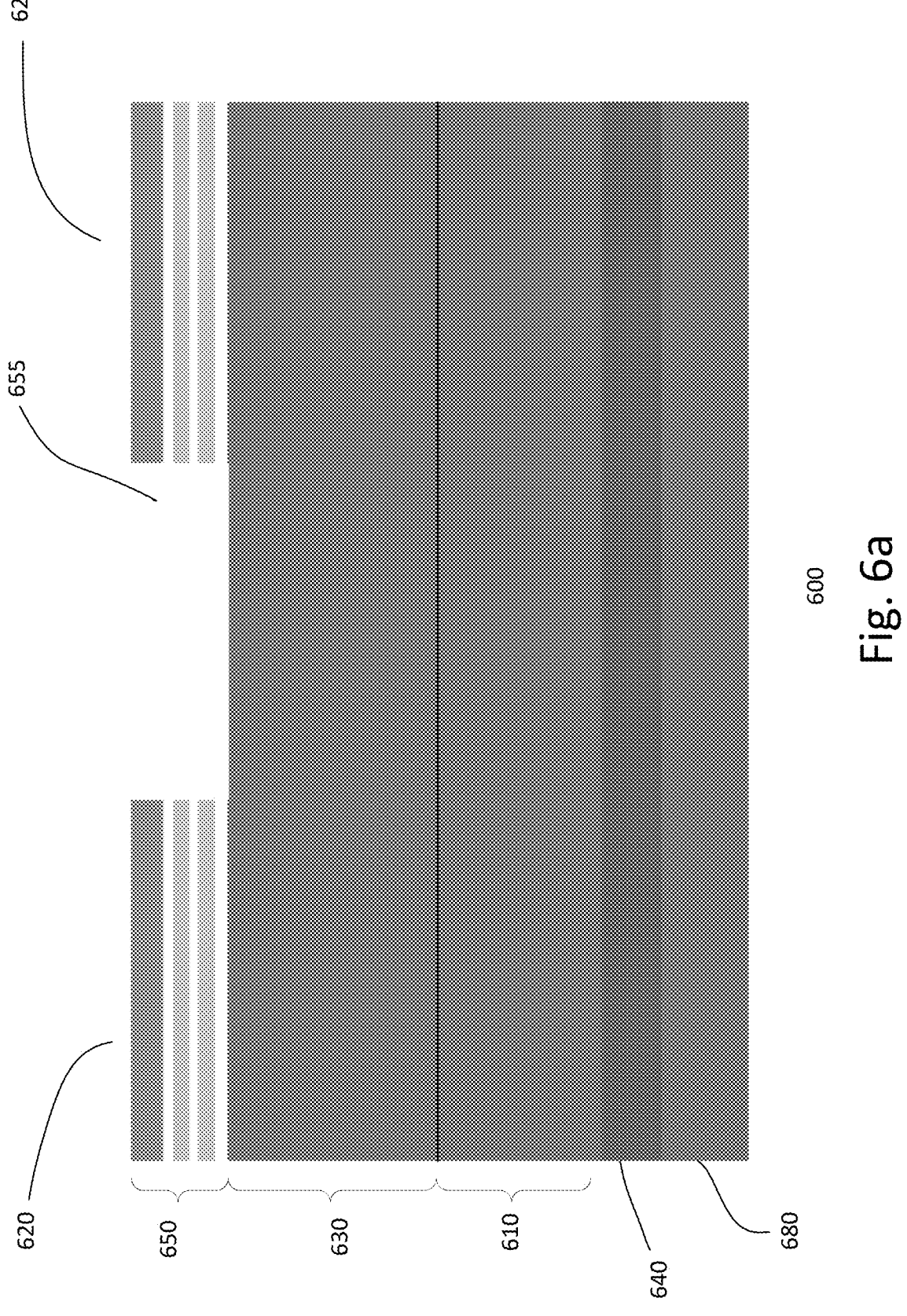
FIGS. 6a-6c shows show a simplified cross-sectional view depicting yet another process for plasma dicing a wafer.
Figure 6B:
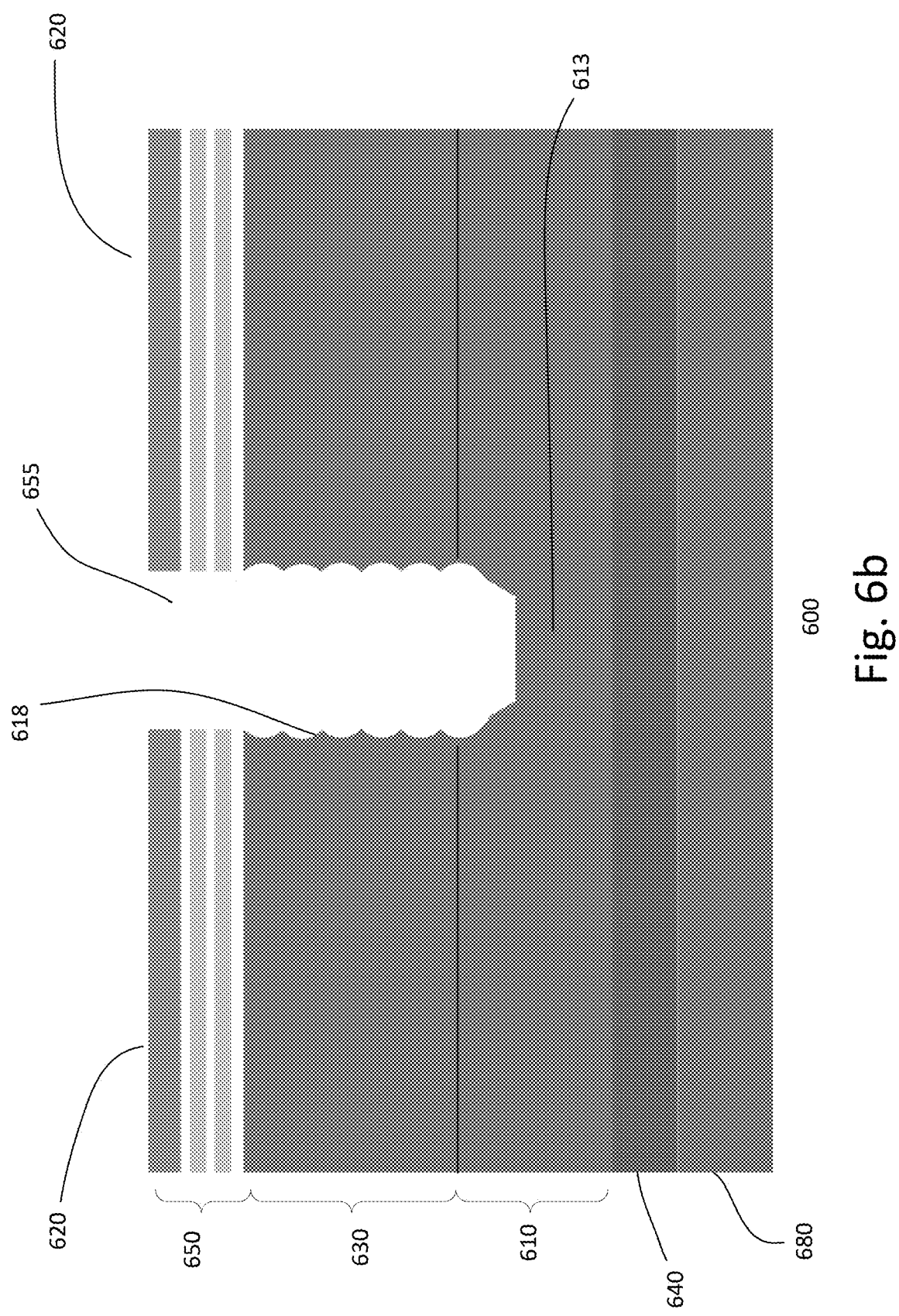
Figure 6C:
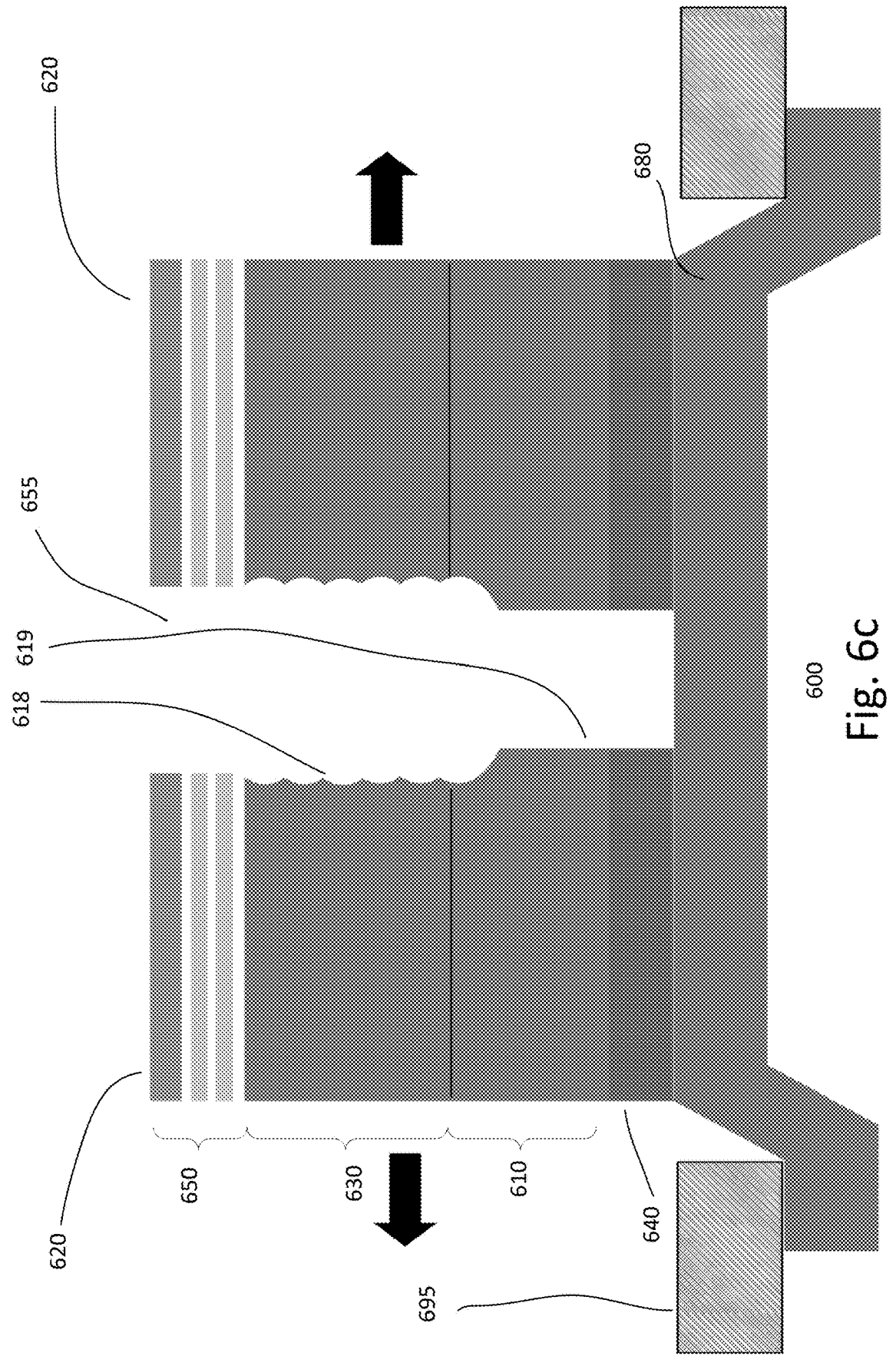

FIGS. 6a-6c show simplified cross-sectional views of yet another embodiment of a process 600 for plasma dicing a processed wafer to singulate it into individual dies. Illustratively, a portion of the wafer is shown. The processed wafer, including the portion of the wafer, is similar to that shown in FIGS. 1a-1b, the dies are similar to the die described in FIG. 2c, and the process is similar to processes described in FIGS. 4a-4e and 5a-5d. Common elements may not be described or described in detail.

Referring to FIG. 6a, a processed wafer is shown at the stage of the dicing process illustrated in FIG. 4b. For example, the processed wafer includes a passivation stack 650. A BEOL dielectric 630 and wafer 610 are disposed below the passivation stack. A DAF 640 is attached to the bottom surface of the wafer, which then is mounted onto a dicing tape 680. For example, the dicing tape is mounted or is part of a wafer ring assembly. The passivation stack is patterned to form openings 655 to form plasma dicing lines which expose the kerf regions of the processed wafer. Patterning the passivation layer, in one embodiment, is achieved using laser processing. The openings define dicing lines between adjacent dies 620 formed on the processed wafer. After mask processing is completed, the wafer is transferred to a plasma dicing tool. For example, the wafer is transferred to a plasma chamber of a plasma dicing tool.

Referring to FIG. 6b, plasma processing of the processed wafer with the dicing mask in the plasma tool commences. In one embodiment, plasma partially etches the processed wafer using the passivation stack as the dicing mask. For example, the BEOL dielectric 630 and a portion of the wafer 610 are etched, leaving a remaining portion 613 of the wafer. In one embodiment, the remaining portion of the wafer may have a thickness of about 5-50% of the wafer thickness. Other thicknesses for the remaining portion may also be useful. The plasma processing forms scalloped sidewalls 618 on etched portions of the processed wafer. After plasma processing, the wafer ring assembly is removed from the plasma chamber for the next stage of processing.

Referring to FIG. 6c, the next stage of the singulation process is performed. In one embodiment, the next stage of processing includes expanding the dicing tape laterally to employ force to break the remaining portion of the wafer and DAF. For example, the dicing tape is attached to a film expansion tool 695 to expand the dicing tape. A fixture on the film expansion tool presses down the wafer ring assembly to ensure the tape is evenly expanded, breaking the remaining portion of the wafer and DAF. The side surface of the wafer and the DAF includes a vertical sidewall 619. This completes the singulation process.

As described, since the wafer is only partially etched, backside notching is not an issue. Also, by only using the plasma chamber to etch the processed wafer and not the DAF, cross-contamination of the plasma chamber is avoided. This results in faster cycle time since plasma chamber cleaning is not necessary since only one chemistry is used.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming devices comprising:
   providing a processed wafer processed with a plurality of devices arranged in rows and columns separated by first and second saw streets in first and second orthogonal directions, wherein the processed wafer includes
   a wafer having opposing inactive and active wafer surfaces,
   a BEOL dielectric having opposing top and bottom BEOL dielectric surfaces, wherein the bottom surface is disposed on the active wafer surface,
   a passivation layer having opposing top and bottom passivation surfaces, wherein the bottom passivation surface is disposed on the top BEOL dielectric surface, the passivation layer includes passivation openings to expose the top BEOL dielectric surface for plasma dicing the wafer;
   a die attach film (DAF) attached to the inactive wafer surface;
   plasma etching the processed wafer exposed by the passivation openings, wherein the plasma etching etches the BEOL dielectric and an upper portion of the wafer to form sidewall surfaces, wherein the plasma etching leaves a remaining lower portion of the wafer and the DAF; and laterally stretching the wafer to singulate the wafer into devices by breaking the remaining lower portion of the wafer and the DAF, wherein the sidewall surfaces form a first device sidewall portion of the devices, and the remaining lower portion of the wafer and the DAF forms a second device sidewall portion of the devices.

2. The method of claim 1 wherein the second device sidewall portion comprises:

a wafer foot extension; and a vertical flat wafer sidewall surface, the wafer foot extension extends the vertical flat wafer sidewall surface beyond the first device sidewall portion of the devices.

3. The method of claim 2 wherein the second device sidewall portion further comprises a vertical flat DAF sidewall surface, the vertical flat DAF sidewall surface is aligned with the vertical flat wafer sidewall surface.

4. The method of claim 3 wherein the vertical flat DAF sidewall surface and the vertical flat wafer sidewall surface comprise force separated surfaces.

5. The method of claim 1 comprises a third device sidewall portion, the third device sidewall portion is defined by side passivation side surfaces, the side passivation side surfaces comprise vertical flat passivation sidewall surfaces.

6. A method of forming devices comprising:

providing a processed wafer processed with a plurality of devices arranged in rows and columns separated by first and second saw streets in first and second orthogonal directions, wherein the processed wafer includes a wafer having opposing inactive and active wafer surfaces, a BEOL dielectric having opposing top and bottom BEOL dielectric surfaces, wherein the bottom BEOL dielectric surface is disposed on the active wafer surface, a passivation layer having opposing top and bottom passivation surfaces, wherein the bottom passivation surface is disposed on the top BEOL dielectric surface, the passivation layer includes passivation openings to expose the top BEOL dielectric surface for plasma dicing the wafer;

a die attach film (DAF) attached to the inactive wafer surface;

plasma etching the processed wafer exposed by the passivation openings, wherein the plasma etching etches the BEOL dielectric and the wafer to form scalloped device sidewall surfaces; and laser cutting the DAF in the passivation openings, wherein laser cutting causes the DAF to creep up to cover a lower portion of the scalloped device sidewall surfaces.

7. The method of claim 6 wherein the laser cutting partially cuts the DAF.

8. The method of claim 7 further comprises laterally stretching the wafer with the partially cut DAF to singulate the wafer into devices, wherein the DAF forms a second device sidewall portion.

9. The method of claim 6 wherein the laser cutting partially cuts the DAF below the inactive wafer surface.

10. The method of claim 6 wherein the laser fully cuts the DAF to singulate the processed wafer into devices.

11. The method of claim 8 wherein the second device sidewall portion comprises:

a DAF foot extension; and a vertical flat DAF sidewall surface, wherein the DAF foot extension extends the vertical flat DAF sidewall surface beyond the lower portion of the scalloped device sidewall surfaces.

12. The method of claim 6 wherein the passivation layer comprises vertical flat passivation sidewall surfaces.

13. The method of claim 1 wherein the sidewall surfaces comprise scalloped device sidewall surfaces.

14. The method of claim 1 wherein the lower portion of the wafer has a thickness of about 5-50% of the wafer thickness.

15. The method of claim 1 wherein the passivation openings comprise laser etched passivation openings.

16. The method of claim 6 wherein the passivation openings comprise laser etched passivation openings.

* * * * *